United States Patent
Delmont

(10) Patent No.: US 7,565,995 B2
(45) Date of Patent: Jul. 28, 2009

(54) ROLLER WIRE BRAKE FOR WIRE BONDING MACHINE

(75) Inventor: Scott Anthony Delmont, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 515 days.

(21) Appl. No.: 11/331,937

(22) Filed: Jan. 13, 2006

(65) Prior Publication Data

US 2006/0118597 A1 Jun. 8, 2006

Related U.S. Application Data

(62) Division of application No. 10/733,190, filed on Dec. 11, 2003, now Pat. No. 7,044,356.

(51) Int. Cl.
*B23K 1/06* (2006.01)
*B23K 37/00* (2006.01)

(52) U.S. Cl. .......................... 228/1.1; 228/4.5; 228/904

(58) Field of Classification Search ............. 228/110.1, 228/1.1, 180.5, 212, 44.3, 44.7, 4.5, 904; 156/358, 580.1, 64, 73.1
See application file for complete search history.

(56) References Cited

U.S. PATENT DOCUMENTS

| | | |
|---|---|---|
| 3,458,921 A | 8/1969 | Christensen ................ 228/102 |
| 4,019,073 A | 4/1977 | Vishnevsky et al. ......... 310/322 |
| 4,777,398 A | 10/1988 | Shibuya ...................... 310/328 |
| 5,314,175 A * | 5/1994 | Izumi et al. .................. 269/224 |
| 5,775,567 A * | 7/1998 | Lo et al. ...................... 228/1.1 |
| 5,931,452 A * | 8/1999 | Nakatomi et al. ........... 269/216 |
| 6,089,439 A * | 7/2000 | Yamazaki et al. ............ 228/4.5 |
| 6,225,589 B1 * | 5/2001 | Bartok ..................... 219/69.15 |
| 6,225,599 B1 * | 5/2001 | Altekruse .............. 219/137.31 |
| 6,299,051 B1 | 10/2001 | Tsujino ....................... 228/110 |
| 6,427,894 B1 * | 8/2002 | Blank et al. ................. 226/177 |
| 6,439,448 B1 * | 8/2002 | Ringler .................... 228/110.1 |
| 6,471,116 B2 * | 10/2002 | Copperthite ............. 228/180.5 |

(Continued)

FOREIGN PATENT DOCUMENTS

JP 59-82269 5/1984

(Continued)

*Primary Examiner*—Jessica L Ward
*Assistant Examiner*—Carlos Gamino
(74) *Attorney, Agent, or Firm*—Yingsheng Tung; Wade J. Brady, III; Frederick J. Telecky, Jr.

(57) ABSTRACT

While fabricating a packaged semiconductor chip, a wire is bonded on a chip contact pad using a wire bonding machine. A bond head of the wire bonding machine is moved relative to the chip contact pad, thereby pulling a first length of the wire out of the wire bonding machine. Part of the wire passes through a space between a first outer edge of a first bearing race and a second outer edge of a second bearing race during the pulling of the first length. The wire is bonded on a lead. A first piezoelectric element is energized in the bond head, thereby causing it to expand and press against the first bearing race, which brakes the first bearing race and brakes the wire between the first and second races. The bond head is moved relative to the lead during the braking and severs the wire proximate to the lead.

20 Claims, 12 Drawing Sheets

U.S. PATENT DOCUMENTS

| | | |
|---|---|---|
| 6,685,083 B2 | 2/2004 | Jiang et al. ................ 228/180.5 |
| 2002/0190043 A1* | 12/2002 | Rice et al. .............. 219/130.31 |
| 2004/0232203 A1* | 11/2004 | Gaunekar et al. .......... 228/44.3 |
| 2005/0011865 A1* | 1/2005 | Jeon ........................ 219/86.25 |
| 2005/0133563 A1* | 6/2005 | Kim et al. .................... 228/4.5 |

FOREIGN PATENT DOCUMENTS

| | | |
|---|---|---|
| JP | 1-316145 | 12/1989 |
| JP | 2004-47665 | 2/2004 |

* cited by examiner

ROLLER WIRE BRAKE FOR WIRE BONDING MACHINE

This is a divisional application of application Ser. No. 10/733,190 filed Dec. 11, 2003, now U.S. Pat. No. 7,044,356, the contents of which are herein incorporated by reference in its entirety.

TECHNICAL FIELD

The present invention generally relates to wire bonding machines. In one aspect it relates more particularly to a roller wire braking assembly in a bond head of a wire bonding machine.

BACKGROUND

Wire bonding machines are often used in forming a first wire bond on a contact pad of a semiconductor chip, extending the wire from the contact pad to a lead finger for a package lead (e.g., in a leadframe), forming a second wire bond on the lead finger, and then severing the wire near the second wire bond. This process may be repeated a rate of about 10 times per second during the fabrication of a packaged semiconductor chip, for example.

A typical wire bonding machine has a bond head that feeds the wire through a capillary and that moves the capillary relative to the chip and leadframe to form the wire bonds. During a typical wire bonding process, as described above, the wire is fed due to the motion of the bond head relative to a wire bond just formed. For example, after a first wire bond is performed on a chip contact pad, the end of the wire is attached to the chip contact pad. Movement of the bond head relative to the chip contact pad (where the wire tip is attached) causes the wire to be pulled out of the bond head through the capillary. Hence, at this point, the wire is not constrained from being fed out of the capillary by the bond head. After the wire is bonded to a lead finger (e.g., by pressing the wire against the lead finger with the capillary), the wire is typically severed. In a conventional wire bonding machine, the wire is severed at this time by clamping onto the wire within the bond head while moving the bond head relative to the second wire bond (where the wire is attached to the lead finger, for example). Such action causes the wire to sever at or near the second wire bond site. Typically, a short length of the wire is allowed to be drawing out of the capillary before clamping onto the wire to cause it to sever at the second wire bond. This short length of wire left extending from the tip of the capillary after severing the wire is often referred to as a pigtail. The pigtail is then exposed to a flame to cause the wire tip to melt. Such melting of the wire tip causes the wire tip to have a ball shape. Note that, although very common, the wire bonding process just described is just one example wire bonding process, and many other wire bonding processes may exist.

When the wire is clamped for initiating the severing of the wire, the clamping action in a conventional wire bonding machine is usually provided by two flat plates of a clamp that move toward each other and sandwich part of the wire therebetween. When it is desired to allow the wire to be drawn out of the capillary, the clamp is opened and left open (i.e., the flat plates move away from each other) to allow the wire to slide relatively freely between the flat plates. A downside to this conventional design, however, is that the flat plates often flatten a portion of the wire where the wire is clamped upon by the flat plates, which may be undesirable. Hence, there is a need for a way for a bond head to clamp or hold the wire without damaging or flattening the wire at the location where the wire is held.

SUMMARY OF THE INVENTION

The problems and needs outlined above may be addressed by embodiments of the present invention. In accordance with one aspect of the present invention, a wire bonding machine is provided, which includes a bond head adapted to manipulate a wire. The bond head includes a wire braking apparatus and a fixed portion. The wire braking apparatus includes a first bearing member, a second bearing member, and a first piezoelectric element. The first bearing member includes a first race adapted to rotate about a first rotational axis of the first bearing member. The first race has a first outer end with a first generally concave-shaped portion. The first race has a first side and a second side. The first and second sides of the first race face opposite directions along the first rotational axis. The second bearing member includes a second race adapted to rotate about a second rotational axis of the second bearing member. The second race has a second outer edge with a second generally concave-shaped portion. The first outer end of the first race faces the second outer end of the second race. The first piezoelectric element is located between the first bearing and the fixed portion of the bond head. The first piezoelectric element is configured so that a first tolerance gap exists between the first piezoelectric element and at least one of the first race and the fixed portion when the first piezoelectric element is not energized. The first piezoelectric element is also configured so that the first piezoelectric element may be energized to expand between the fixed portion and the first bearing thereby substantially eliminating the first tolerance gap, and to press against the first side of the first race thereby hindering rotational movement of the first race relative to the fixed portion of the bond head. Note that the term "energized" as used herein generally refers to applying an electric field or a voltage to an piezoelectric element so that it will expand or contract in one or more directions due to the electrical energy or change in electrical energy (increasing or decreasing) applied thereto.

In accordance with another aspect of the present invention, a wire bonding machine is provided, which includes a bond head adapted to manipulate a wire. The bond head includes a wire braking apparatus and a support member. The wire braking apparatus includes a first bearing member, a second bearing member, and a first piezoelectric element. The first bearing member includes a first race adapted to rotate about a first rotational axis of the first bearing member. The second bearing member includes a second race adapted to rotate about a second rotational axis of the second bearing member. The first race is opposite the second race in a configuration for accepting a wire fed between and in contact with the first and second race. The first piezoelectric element is located proximate to the first race of the first bearing so that a first tolerance gap exists between the first piezoelectric element and the first race when the first piezoelectric element is not energized, and so that the first piezoelectric element may be energized to expand to thereby substantially eliminate the first tolerance gap and to press against the first race thereby hindering rotational movement of the first race relative to the support member of the bond head.

In accordance with yet another aspect of the present invention, a method of fabricating a packaged semiconductor chip is provided. This method includes the following steps described in this paragraph. The order of the steps may vary, may be sequential, may overlap, may be in parallel, and combinations thereof. A wire is bonded on a chip contact pad of a semiconductor chip using a wire bonding machine. A bond head of the wire bonding machine is moved relative to the chip contact pad, thereby pulling a first length of the wire out of the wire bonding machine. Part of the wire passes through a space between a first outer edge of a first bearing race and a second outer edge of a second bearing race during the pulling of the first length. The wire is bonded on a lead using the wire bonding machine. A first piezoelectric element is energized in the bond head, thereby causing the first piezoelectric element to expand and press against the first bearing race. The first bearing race is braked by the pressing of the first piezoelectric element against the first bearing race. The wire is braked between the first and second races at least partially by the braking of the first bearing race. The bond head is moved relative to the lead during the braking of the wire. The wire is severed proximate to the lead.

In accordance with another aspect of the present invention, a wire bonding machine is provided, which includes a bond head adapted to manipulate a wire. The bond head includes a wire braking apparatus and a support member. The wire braking apparatus includes a first bearing member, a second bearing member, and a bearing braking actuator. The first bearing member includes a first race adapted to rotate about a first rotational axis of the first bearing member. The second bearing member includes a second race adapted to rotate about a second rotational axis of the second bearing member. The first race is opposite the second race in a configuration for accepting a wire fed between and in contact with the first and second race. The bearing braking actuator is located proximate to the first race of the first bearing so that the bearing braking actuator may be actuated to brake the first race thereby hindering rotational movement of the first race relative to the support member of the bond head.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
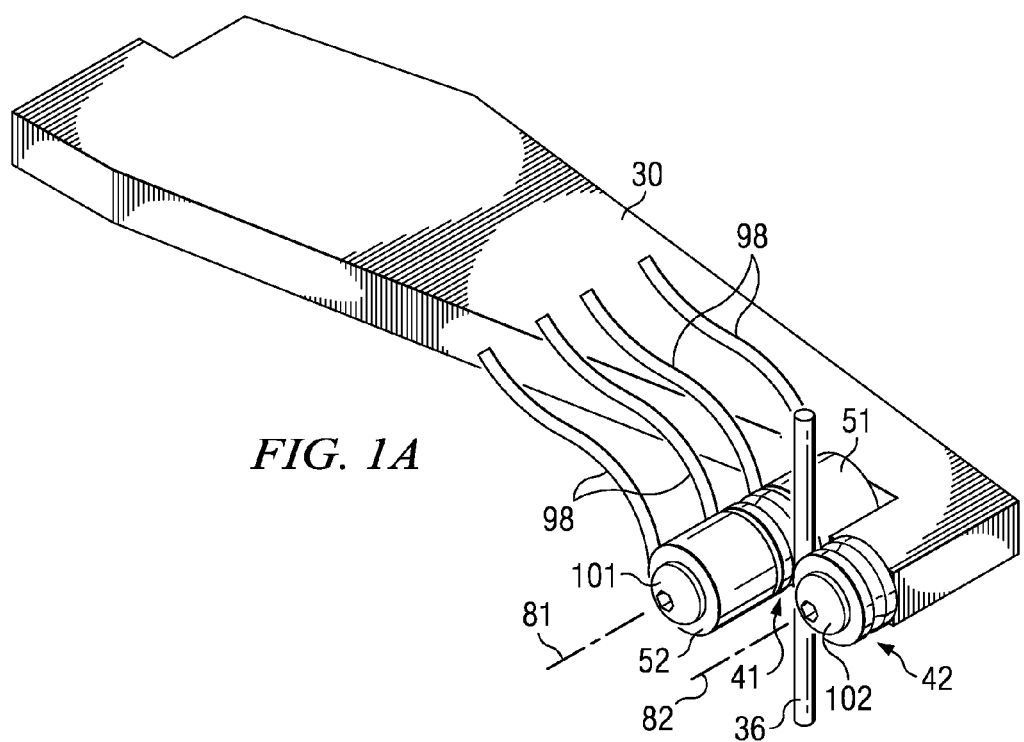
FIGS. 1A-3 show various views of a first embodiment of the present invention.
Figure 1B:
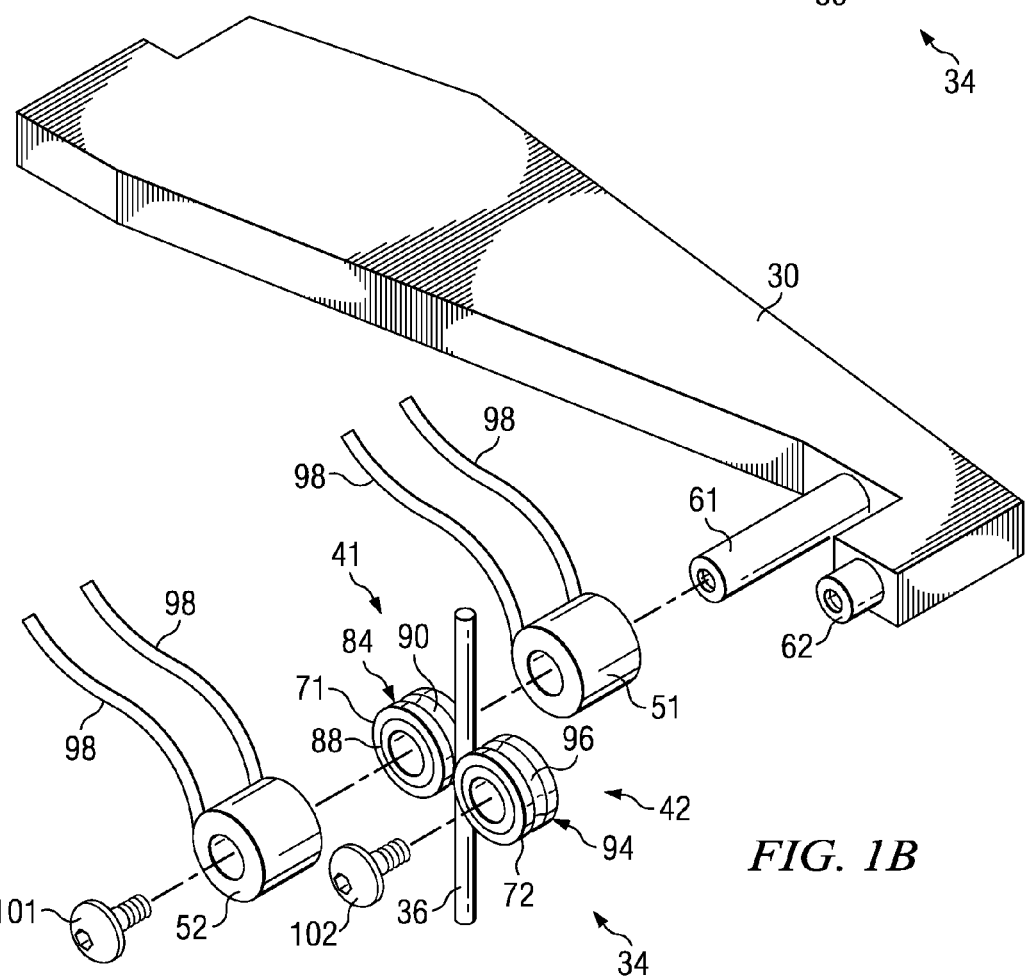

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a wire bonding machine having a bond head with a wire braking apparatus for braking or holding the wire (e.g., so that the wire may be severed during a typical wire bonding operation). Such wire is typically made from a soft, malleable metal, such as gold, for example. Thus, it is usually desirable to handle the wire with care to prevent damage to the wire.

Figure 2:
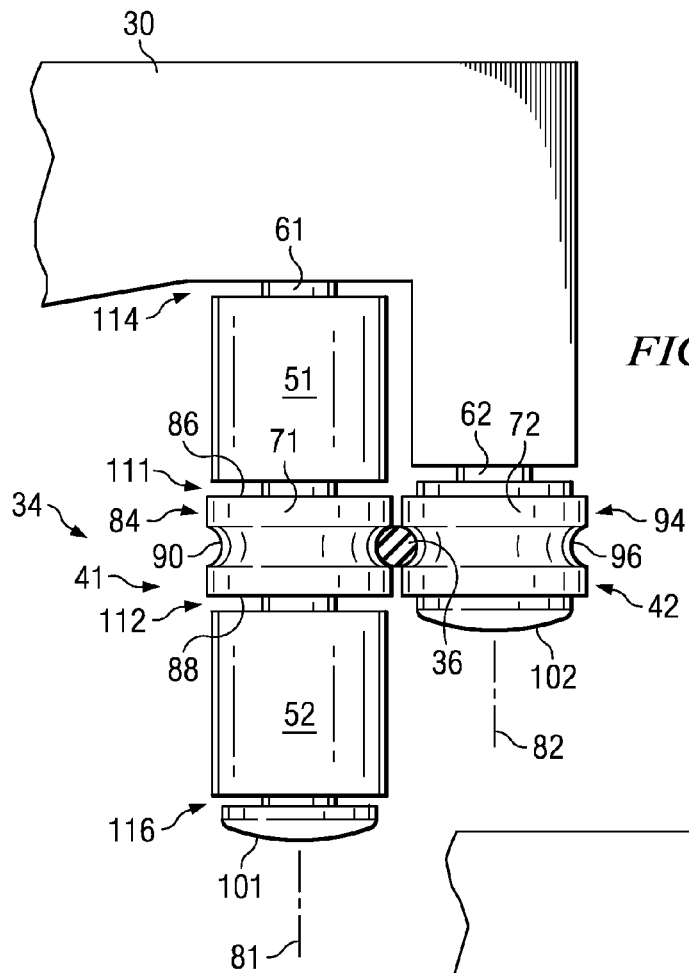
Figure 3:
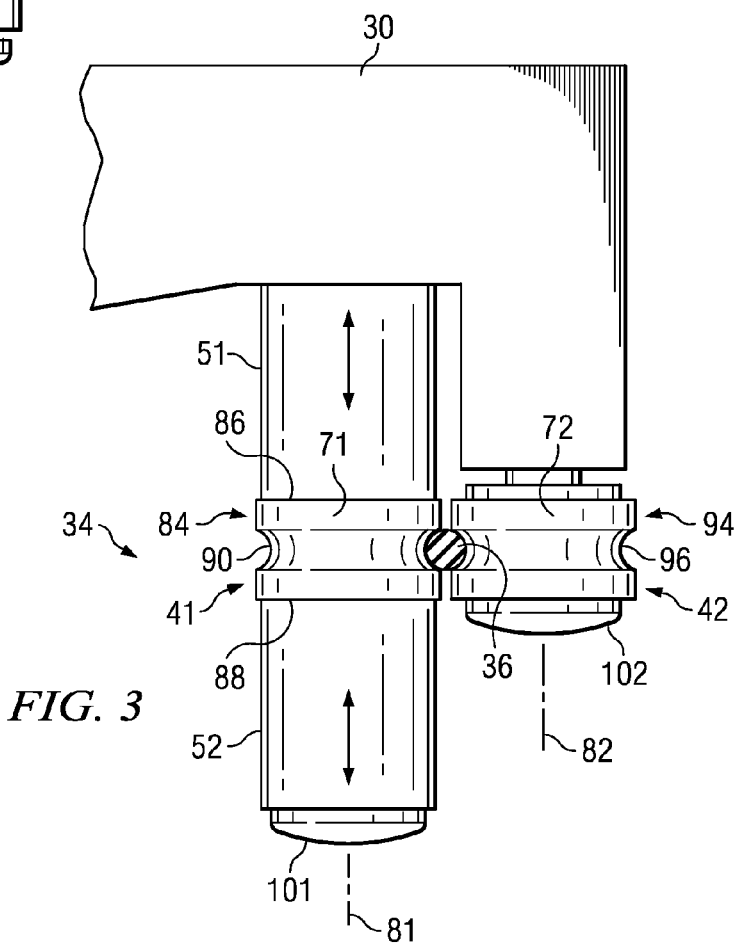

FIGS. 1A-3 illustrate various views of a first embodiment of the present invention. FIGS. 1A and 1B show perspective views of a portion of a support member 30 for a bond head of a wire bonding machine. The bond head has a wire braking apparatus 34, which is the focus of FIGS. 1A-3. FIG. 1A shows the wire braking apparatus 34 in an operably assembled configuration and with a wire 36 extending therethrough for illustrating the fed path of the wire 36 therethrough. FIG. 1B shows the wire braking apparatus 34 in an exploded view to better illustrate some of its components. FIGS. 2 and 3 are top views of a portion of FIG. 1A.

Referring to FIGS. 1A-3 to describe the first embodiment, the wire braking apparatus 34 has a first bearing member 41, a second bearing member 42, a first piezoelectric element 51, and a second piezoelectric element 52. A first-shaft 61 extends from the support member 30. The first bearing member 41 is located on the first shaft 61. The first bearing member 41 has a first bearing race 71 that is configured to freely rotate about a first rotational axis 81, which extends along the first shaft 61. The first race 71 has a first outer end 84, a first side 86, and a second side 88. The first outer end 84 of the first embodiment has a first generally concave-shaped portion 90, as is preferred. This portion may have a round, oval, or elliptical shape, for example. In the example provided by the first embodiment, the first outer end 84 has a round radius that is slightly smaller than the cross-section radius of the wire 36. In other embodiments, however, the radius of the first outer end 84 may be about the same as or greater than that of the wire 36.

In the first embodiment, a second shaft 62 also extends from the support member 30. The second bearing member 42 is located on the second shaft 62. The second bearing member 42 has a second bearing race 72, which is configured to freely rotate about a second rotational axis 82. The second rotational axis 82 extends along the second shaft 62. The second bearing race 72 has a second outer end 94, which has a second generally concave-shaped portion 96, like that of the first outer end 84. The second outer end 94 of the second race 72 faces the first outer end 84 of the first race 71. The space between the first outer end 84 and the second outer end 94 thus provides a tight fit for the wire 36 in this case. Hence, when the wire 36 moves though the space between the first and second races 71, 72, the wire 36 causes the first and second races 71, 72 to rotate. And conversely, with such configuration, stopping either or both of the races 71, 72 will slow or preferably stop the movement of the wire 36 therethrough to brake the wire 36.

The first embodiment is configured to provide braking of the first race 71, which in turn brakes the wire 36 and the second race 72, as will be explained next. The first and second piezoelectric elements 51, 52 may be located on the first shaft 61, as shown in FIGS. 1A-3. Note in FIGS. 2 and 3, the electrical wires 98 for the piezoelectric elements 51, 52 (see e.g., FIGS. 1A and 1B) have been omitted for purposes of simplifying the views in FIGS. 2 and 3. The first piezoelectric element 51 may be located between the support member 30 and the first bearing member 41. The first shaft 61 may have a first shaft head 101 located on a distal end thereof, as shown in FIGS. 1A-3, for example. The second piezoelectric element 52 may be located between the first bearing member 41 and the first shaft head 101. The size of the first and second piezoelectric elements 51, 52, the width of the first bearing member 41, and the length of the first shaft 61 are configured so that a first tolerance gap 111 exists between the first piezoelectric element 51 and the first race 71 when the first piezoelectric element 51 is not energized, and so that a second tolerance gap 112 exists between the second piezoelectric element 52 and the first race 71 when the second piezoelectric element 52 is not energized. There may also be a tolerance gap 114 between the first piezoelectric element 51 and the support member 30 when the first piezoelectric element 51 is not energized, as shown in FIG. 2. However, in other embodiments, the first piezoelectric element 51 may be attached to the support member 30 (e.g., by an adhesive). Likewise, there may also be a tolerance gap 116 between the second piezoelectric element 52 and the first shaft head 101 when the second piezoelectric element 52 is not energized, as shown in FIG. 2. In other embodiments, however, the second piezoelectric element 52 may be attached to the first shaft head 101 (e.g., by an adhesive). By having these tolerance gaps 111, 112, the first race 71 may rotate freely when the piezoelectric elements 51, 52 are not energized (e.g., in relaxed states). Also, a spring member (not shown) may be located between a piezoelectric element (e.g., 51, 52) and a bearing (e.g., 41), for example, to bias the piezoelectric element away from the bearing when it is desired to let the bearing race rotate freely.

As illustrated in FIG. 3, the first and second piezoelectric elements 51, 52 may be energized (e.g., applying a sufficient voltage between the two ends of each piezoelectric element) to cause the piezoelectric elements 51, 52 to expand along the first rotational axis 81 and to press against the first race 71. Hence, the first piezoelectric element 51 expands between the support member 30 and the first bearing member 41 to press against the first side 86 of the first bearing race 71, thereby hindering rotational movement of the first race 71 relative to the support member 30. Likewise, the second piezoelectric element 52 expands between the first shaft head 101 and the first bearing member 41 to press against the second side 88 of the first bearing race 71, thereby hindering rotational movement of the first race 71 relative to the first shaft head 101. This braking of the first bearing race 71 is intended to thereby brake the movement of the wire portion that is in contact with the first outer end 84 of the first race 71. Depending on the geometric configurations, the braking of the first race 71 preferably brakes the wire 36 enough to stop the wire 36 and hold the wire 36 in place relative to the bond head sufficiently to sever the wire 36 when the bond head moves relative to a wire bond location.

It is preferable to press against both sides 86, 88 of the first bearing race 71 with two identical piezoelectric elements 51, 52, as shown in FIG. 3, to maintain the axial position of the first bearing member 41 relative to the second bearing member 42. In other embodiments, however, the second piezoelectric element 52 may be omitted so that only the first piezoelectric element 51 presses against only one side (86 or 88) of the first bearing race 71, for example. In such case, it may be preferable to limit the axial movement of the first bearing member 41 along the first shaft 61 during such pressing, e.g., with the first shaft head 101 or with one or more collars placed on the first shaft 61, for example. In other embodiments (not shown), a piezoelectric element may press against the first outer end 84 of the first race 71 to apply a braking force, for example.

Figure 4:
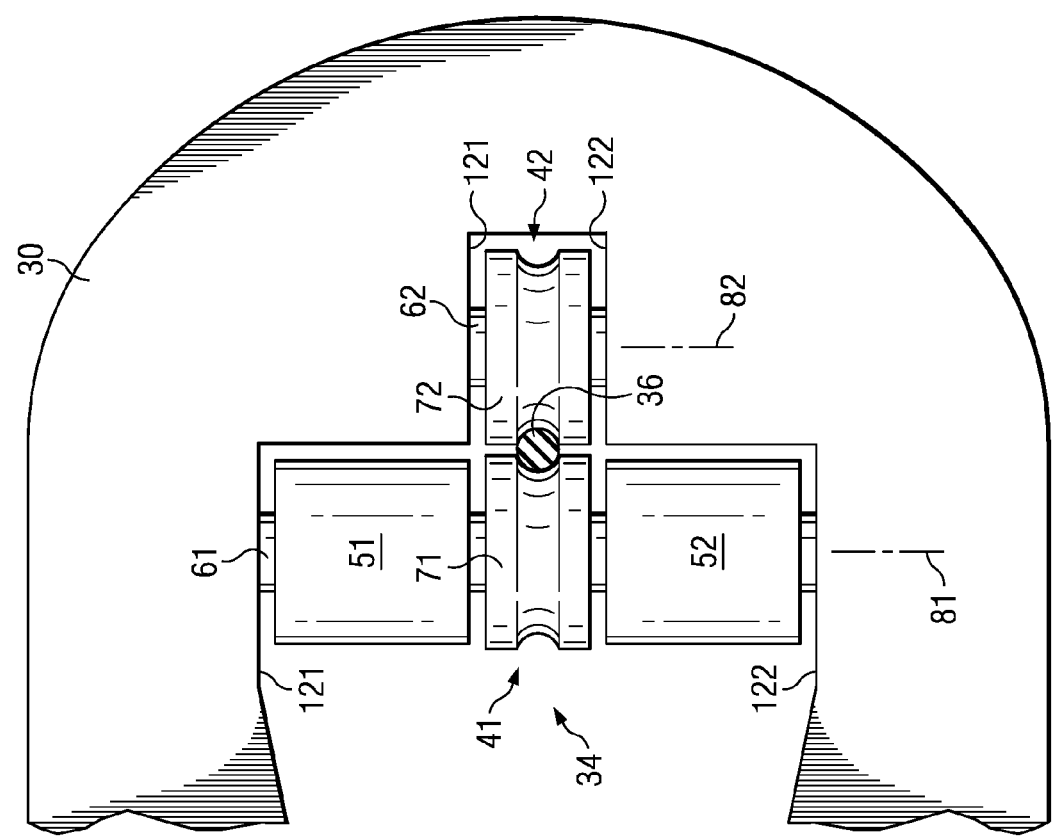
FIG. 4 is a top view of a second embodiment of the present invention.

FIG. 4 is a top view of a second embodiment of the present invention. The second embodiment is similar to the first embodiment, but the support member 30 is configured differently. The support member 30 may extend around the wire braking apparatus 34, as shown in FIG. 4. The support member 30 may have a first interior side 121 and a second interior side 122 separated by a support member gap. In such case, the first and second shafts 61, 62 extend between the first and second interior sides 121, 122 of the support member 30 within the support member gap. Thus, in such case, the first piezoelectric element 51 is located between the first interior side 121 of the support member 30 and the first bearing member 41, and the second piezoelectric member 52 is located between the second interior side 122 of the support member 30 and the first bearing member 41 (see e.g., FIG. 4). Although not shown in FIG. 4, the support member 30 may have multiple pieces fastened together during the assembling of the wire braking apparatus 34, for example.

Figure 5:
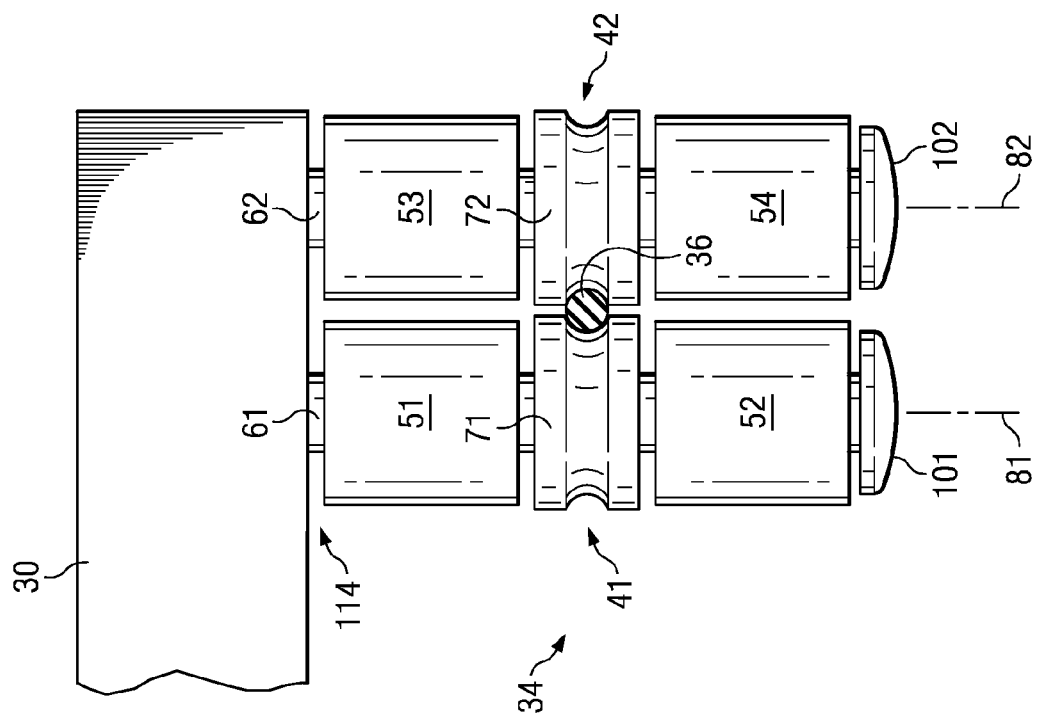
FIG. 5 is a top view of a third embodiment of the present invention.

FIG. 5 is a top view of a third embodiment of the present invention. In the third embodiment, first and second piezoelectric elements 51, 52 are used for braking the first bearing race 71, as in the first and second embodiments (see e.g., FIGS. 1A-4). But also, third and fourth piezoelectric elements 53, 54 may be used to brake the second bearing race 72 in the same way that the first bearing race 71 is braked.

Figure 6:
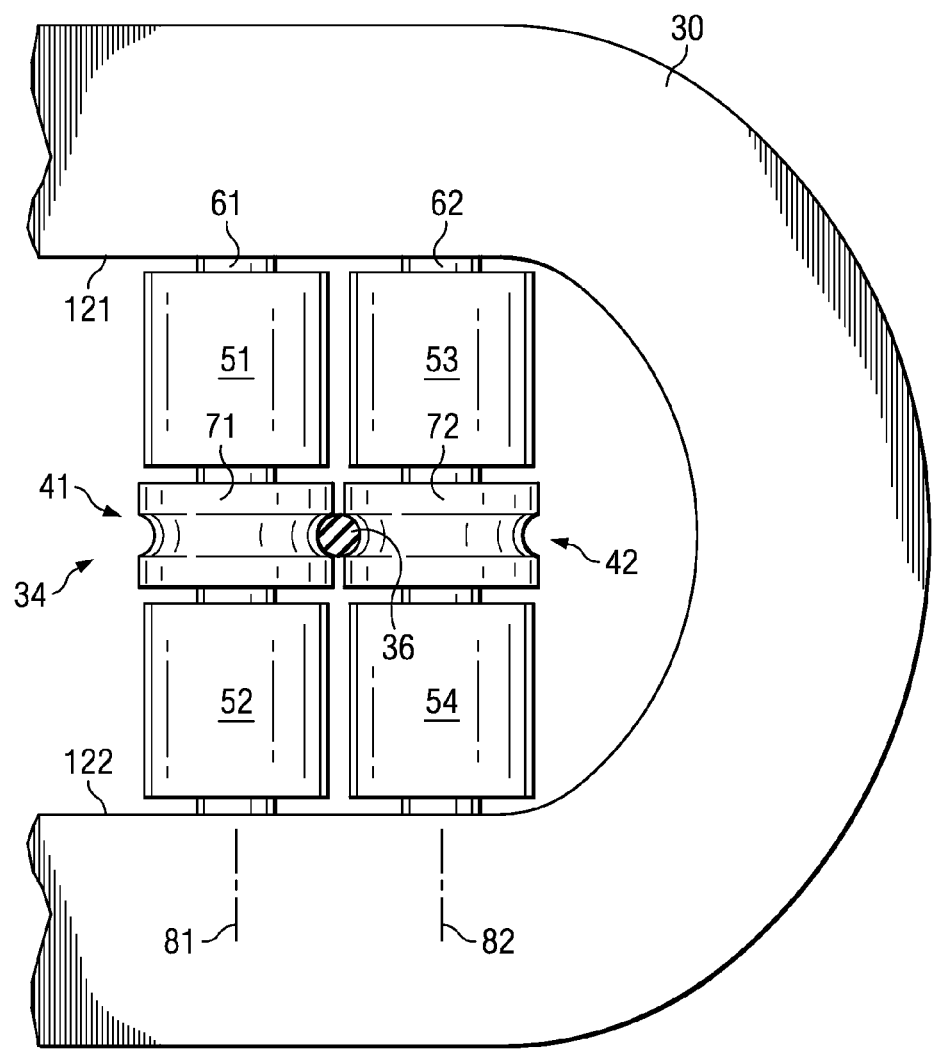
FIG. 6 is a top view of a fourth embodiment of the present invention.

FIG. 6 is a top view of a fourth embodiment of the present invention. The fourth embodiment is a variation upon the third embodiment (see e.g., FIG. 5) by having a different configuration for the support member 30 with respect to the first and second shafts 61, 62. Note that in FIGS. 4-6, the electrical wires 98 (see e.g., FIG. 1B) for applying voltage across the piezoelectric elements 51-54 are not shown for purposes of simplifying the drawings.

In the first through fourth embodiments illustrated by FIGS. 1A-6, the piezoelectric elements 51-54 may be free to pivot or rotate about the shafts 61, 62 on which they are located. However, it may be preferable or necessary to restrict the rotational movement of the piezoelectric elements 51-54. This may be accomplished in a number of ways, as will be apparent to one of ordinary skill in the art. For example, the first piezoelectric element 51 may be adhered to the support member 30 to prevent it from rotating. As another example, the electrical wire 98 connected to the piezoelectric elements 51, 52 may be used to limited the rotational movement of the piezoelectric elements 51, 52, for example. Some of the other embodiments discussed below provide other illustrative ways to limit the rotational movement of the piezoelectric elements.

Figure 7:
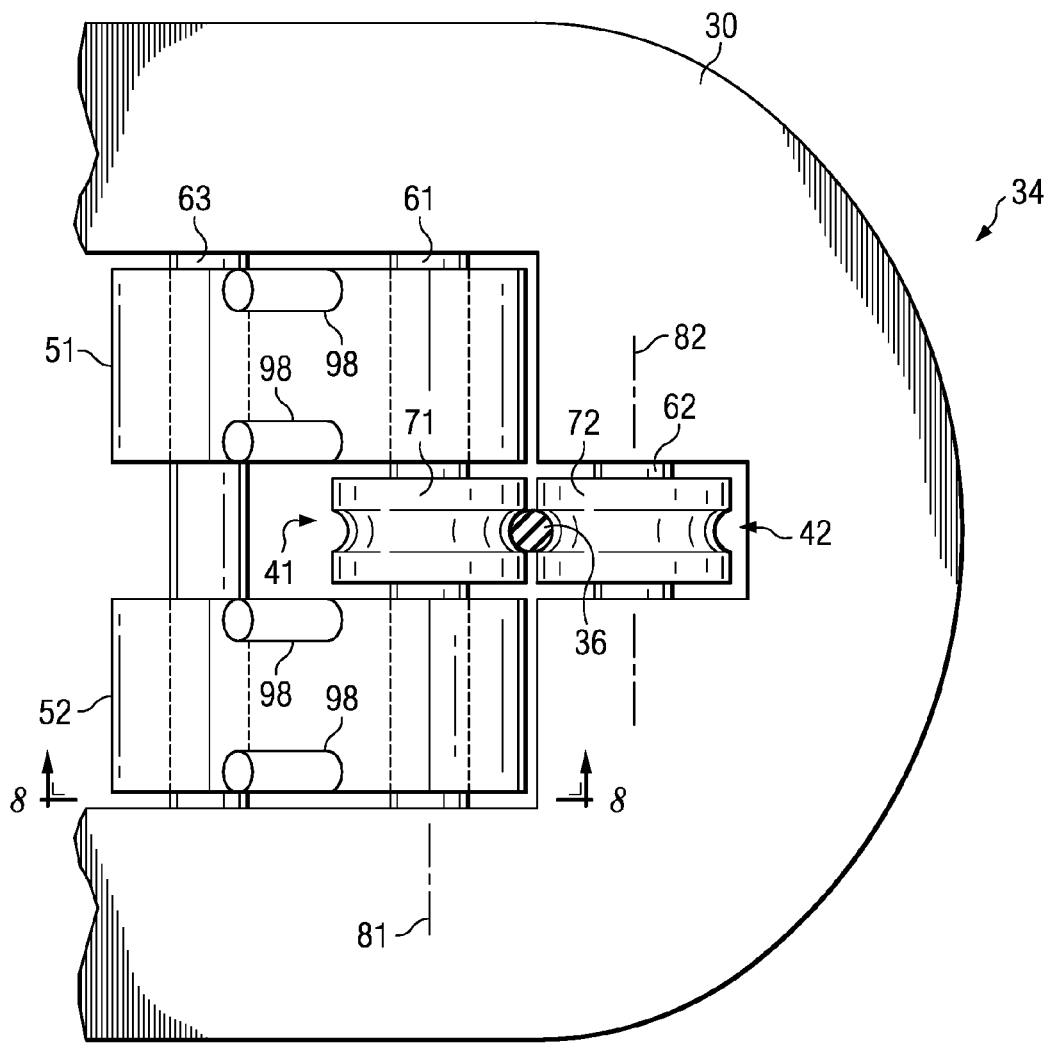
FIG. 7 is a top view of a fifth embodiment of the present invention.
Figure 8:
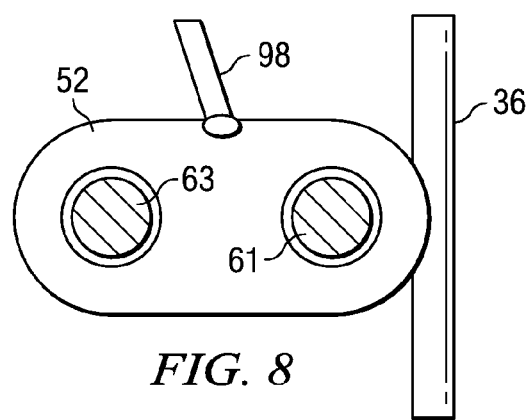
FIG. 8 is a side view of the fifth embodiment, as taken along line 8-8 in FIG. 7.

FIGS. 7 and 8 illustrate a fifth embodiment of the present invention. FIG. 7 is a top view of the fifth embodiment. FIG. 8 is a side view for part of FIG. 7 as taken along line 8-8 in FIG. 7. In the fifth embodiment, a third shaft 63 extends between a first interior side 121 and a second interior side 122 of the support member 30, as well as through the first and second piezoelectric elements 51, 52. Thus, the third shaft 63 limits the pivotable movement of the piezoelectric elements 51, 52 about the first shaft 61, and the third shaft 63 further supports the piezoelectric elements 51, 52. As a variation on the fifth embodiment, the support member 30 may be on only one side of the wire braking apparatus 34 and the shafts 61-63 may have shaft heads, for example.

Figure 9:
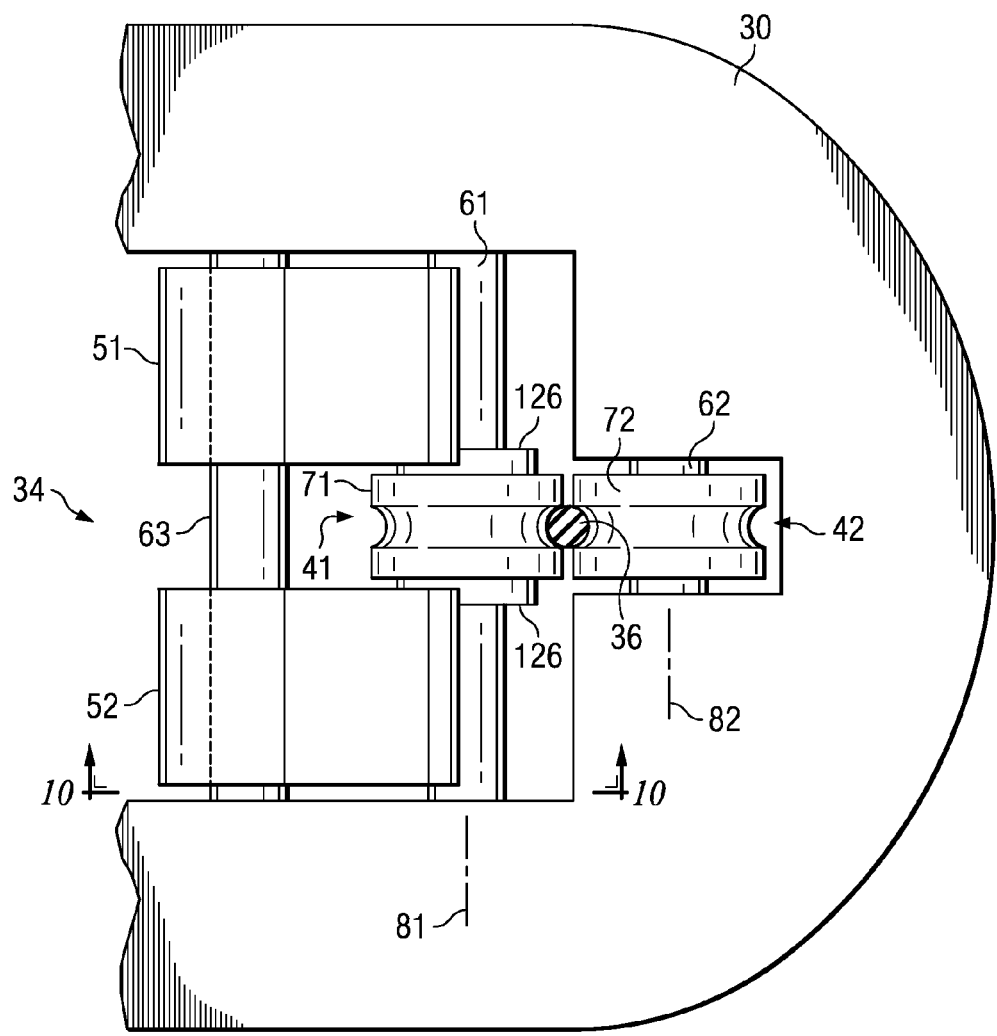
FIG. 9 is a top view of a sixth embodiment of the present invention.
Figure 10:
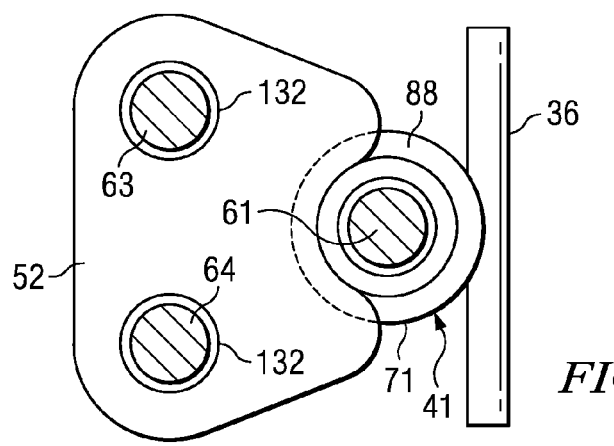
FIG. 10 is a side view of the sixth embodiment, as taken along line 10-10 in FIG. 9.

FIGS. 9 and 10 illustrate a sixth embodiment of the present invention. FIG. 9 is a top view of the sixth embodiment. FIG. 10 is a side view for part of FIG. 9 as taken along line 10-10 in FIG. 9. In the sixth embodiment, the piezoelectric elements 51, 52 are supported by third and fourth shafts 63, 64, and the piezoelectric elements 51, 52 are not located on the first shaft 61 with the first bearing member 41. In such case, collars 126 may be added on the first shaft 61 to retain the position of the first bearing member 41 along the first shaft 61, as shown in FIG. 9. But in other embodiments, the collars 126 may be omitted, for example. In such cases, the piezoelectric elements 51, 52 may help maintain the position of the first bearing member 41 relative to the second bearing member 42, for example.

In an embodiment (e.g., the sixth embodiment), the first shaft 61 may be rotationally fixed with respect to the support member 30 or the first shaft 61 may be configured to rotate about the first rotational axis 81 with respect to the support member 30. In such case where the first shaft 61 is configured to rotate, the first bearing member 41 may be replaced with a fixed portion having a same or similar outer end shape that is attached to or an integral part of the first shaft 61, to provide an equivalent structure, for example. Similarly, in an embodiment of the present invention, the second shaft 62 may be fixed relative to the support member 30 or the second shaft may be configured to rotate about the second rotational axis 82 with respect to the support member 30. In such case where the second shaft 62 is configured to rotate, the second bearing member 42 may be replaced with a fixed portion having a same or similar outer end shape that is attached to or an integral part of the second shaft 62, to provide an equivalent structure, for example.

Figure 11:
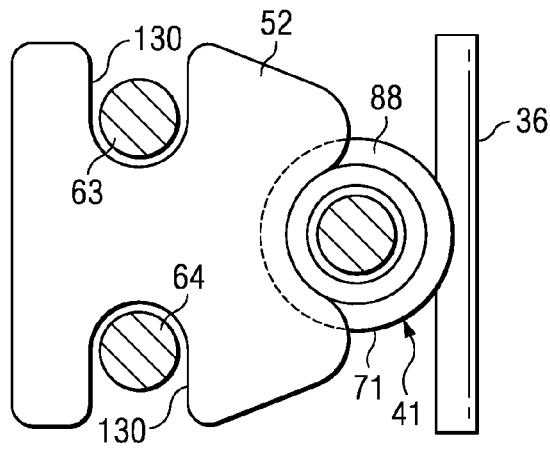
FIGS. 11 and 12 are side views illustrating variations on the sixth embodiment.
Figure 12:
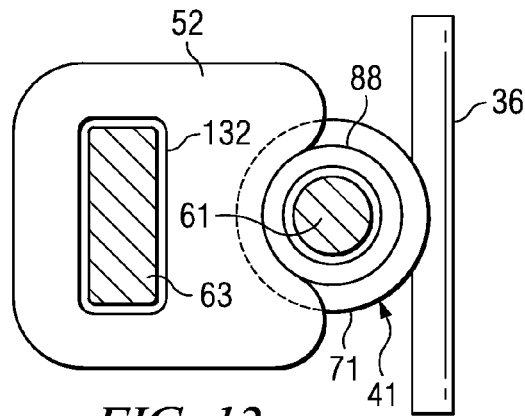

FIG. 11 illustrates a variation of the sixth embodiment, where the piezoelectric elements 51, 52 have slots 130 for accepting the third and fourth shafts 63, 64 rather than holes 132 (see e.g., FIG. 10). FIG. 12 illustrates yet another variation on the sixth embodiment, where the third shaft 63 has a generally rectangular cross-section and the fourth shaft is omitted. Due to the geometric shape of the third shaft 63 in FIG. 12 and the corresponding geometric shape of the holes 132 in the piezoelectric elements through which the third shaft 63 passes through, the third shaft 63 alone may support the piezoelectric elements 51, 52 and limit the pivotal movement of the piezoelectric elements 51, 52 about the first shaft 61. The sixth embodiment may be further varied (in combination with any of the sixth embodiment variations discussed above) by having the support member 30 on only one side of the wire braking apparatus 34 and having shaft heads on the shafts 61-64, for example.

Figure 13:
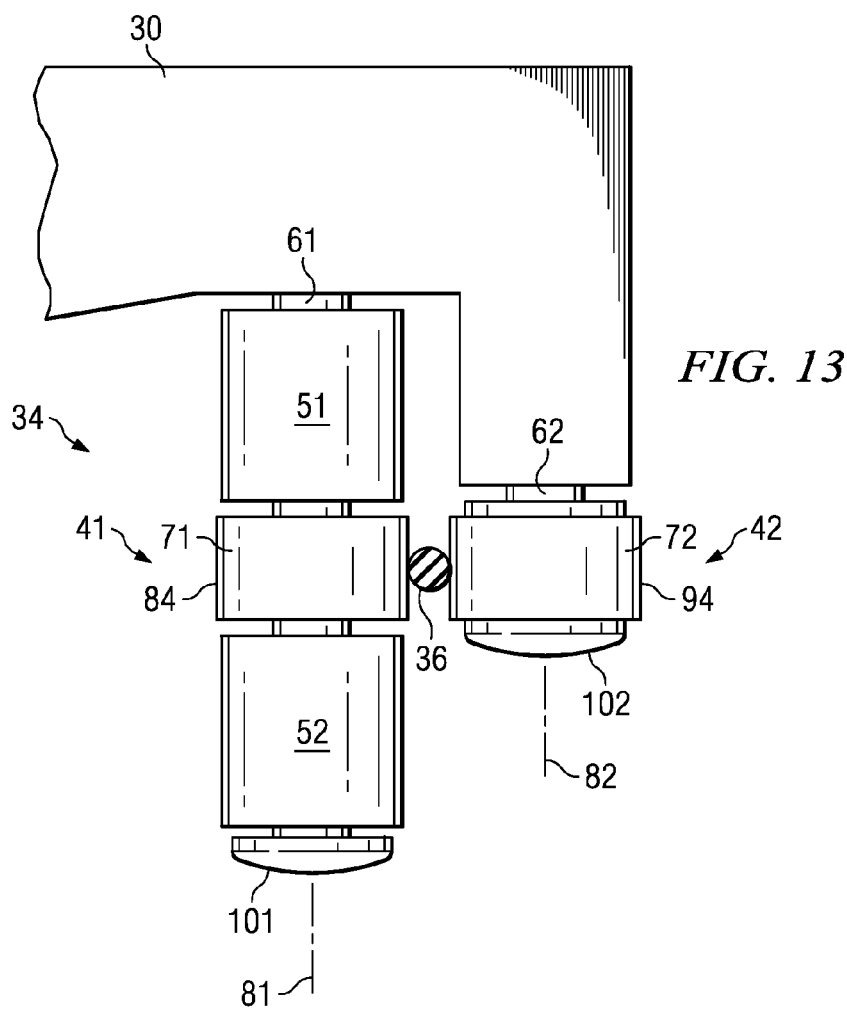
FIG. 13 is a top view of a seventh embodiment of the present invention.

FIG. 13 is a top view of a seventh embodiment of the present invention. The seventh embodiment (see e.g., FIG. 13) is a variation of the first embodiment (see e.g., FIG. 2) in that the first and second outer ends 84, 94 of the first and second bearing races 71, 72 are flat rather than concaved. The seventh embodiment illustrates that the shape of the first and/or second bearing races 71, 72 may vary.

Figure 14:
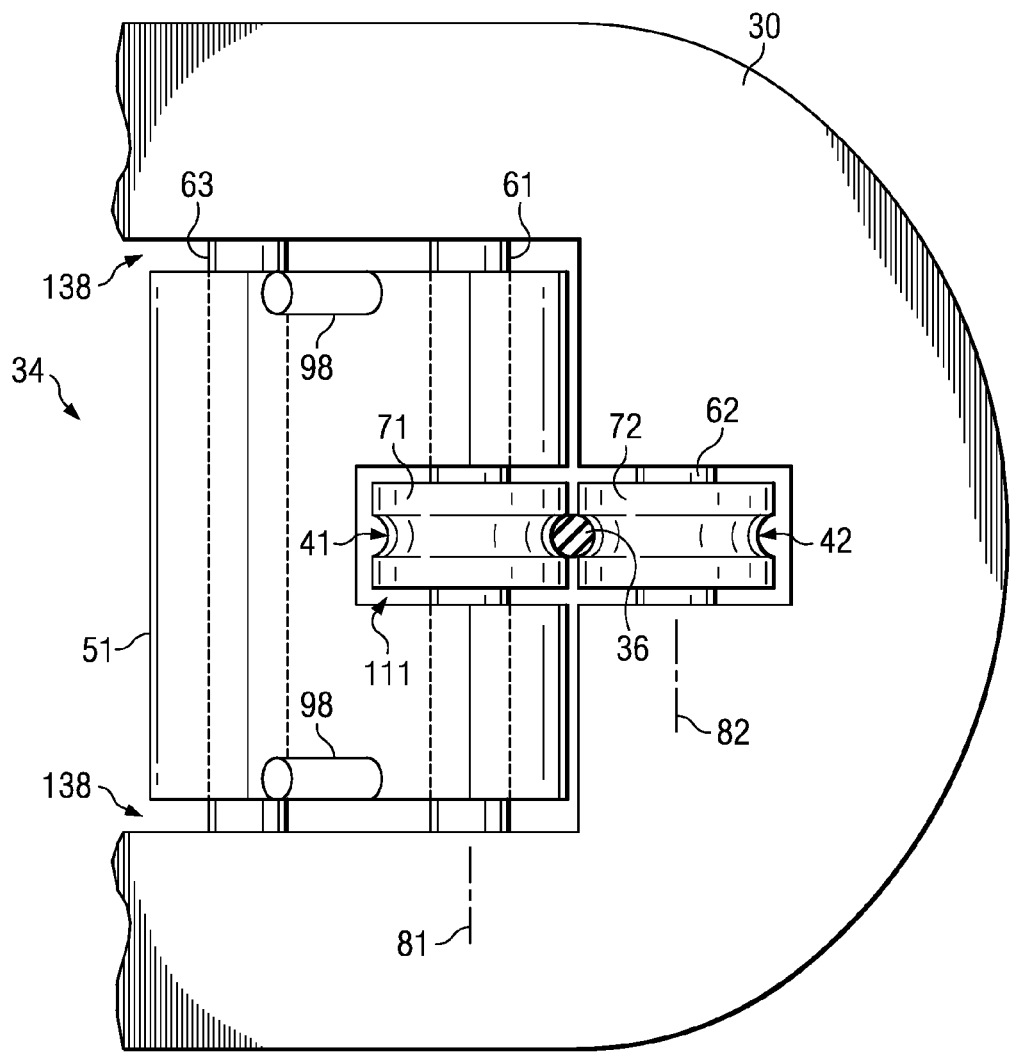
FIGS. 14 and 15 are top views of an eighth embodiment of the present invention.
Figure 15:
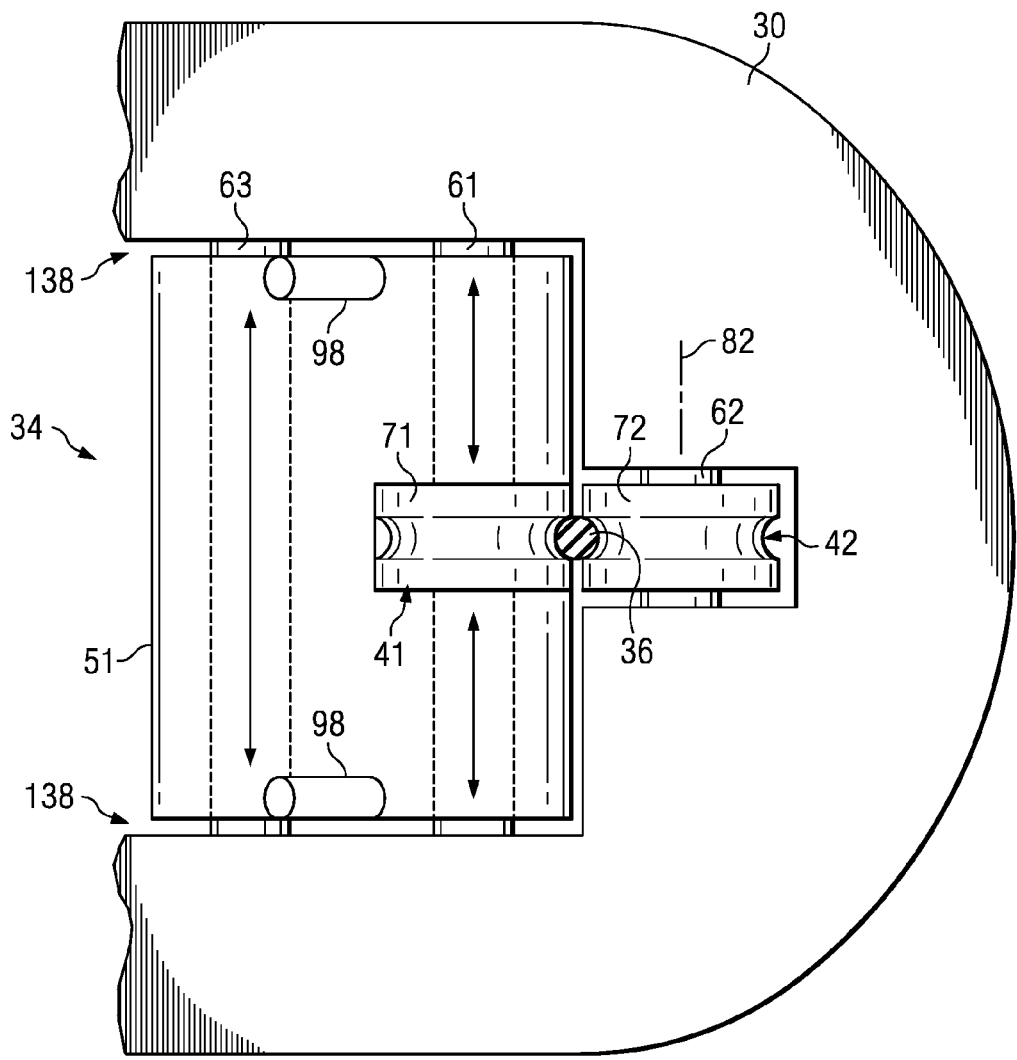

FIGS. 14 and 15 illustrate an eighth embodiment of the present invention. In the eighth embodiment, one piezoelectric element 51 is supported by first and third shafts 61, 63, and the piezoelectric element 51 partially surrounds the first bearing member 41. In FIG. 14, the piezoelectric element 51 is shown in a relaxed or non-energized state so that there is a first tolerance gap 111 between the piezoelectric element 51 and the first bearing race 71. Although extra gaps 138 are shown in FIG. 14 between the piezoelectric element 51 and the support member 30, such gaps may not be needed or desired in other embodiments (e.g., if one of the piezoelectric element ends is adhered to the support member 30). As shown in FIG. 15, the piezoelectric element 51 may configured so that it may be energized to expand at least along the first shaft 61, thereby pressing against the sides 86, 88 of the first bearing race 71 to brake the first bearing race 71. Note in FIG. 15 that the piezoelectric element 51 may not need to expand out to the support member 30 to press against the first bearing race 71 (for braking the first bearing race 71) because part of the first bearing race 71 may be sandwiched between two portions of the piezoelectric element 51. The electrical wires 98 for applying a voltage across the piezoelectric element 51 to cause it to expand along the first shaft 61 are shown in FIGS. 14 and 15 for purposes of illustration. The actual placement of the electrical terminals 98 and the voltage application points may vary from that shown in FIGS. 14 and 15.

Figure 16:
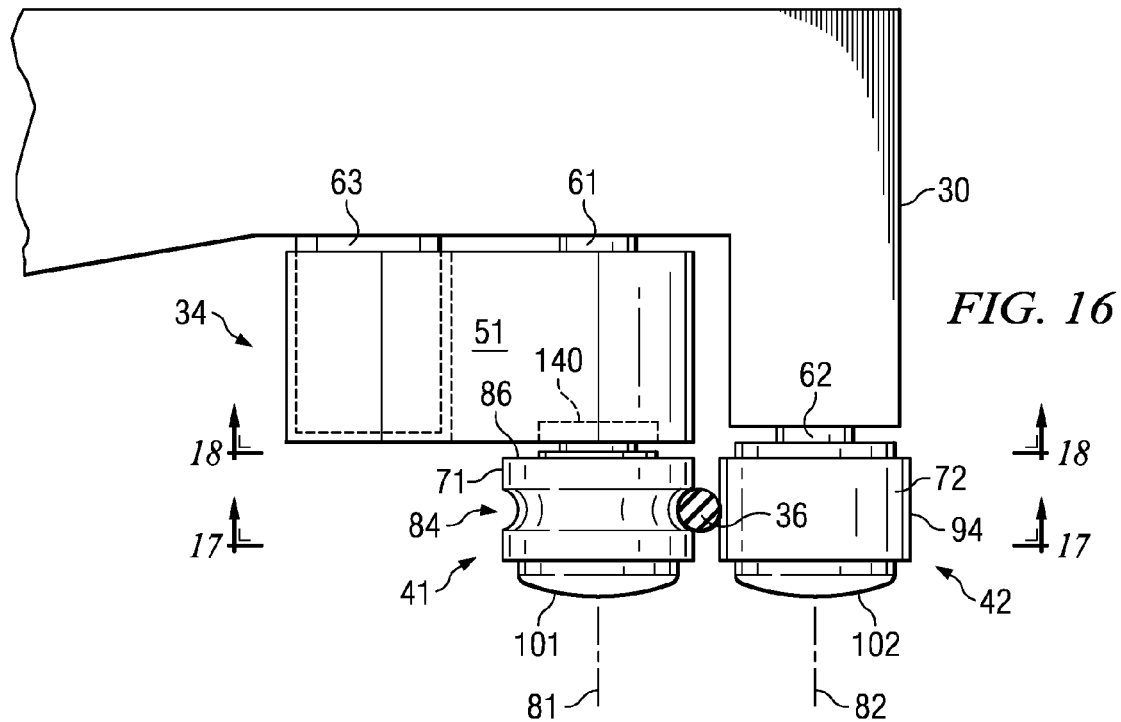
FIGS. 16-18 show views of a ninth embodiment of the present invention.
Figure 17:
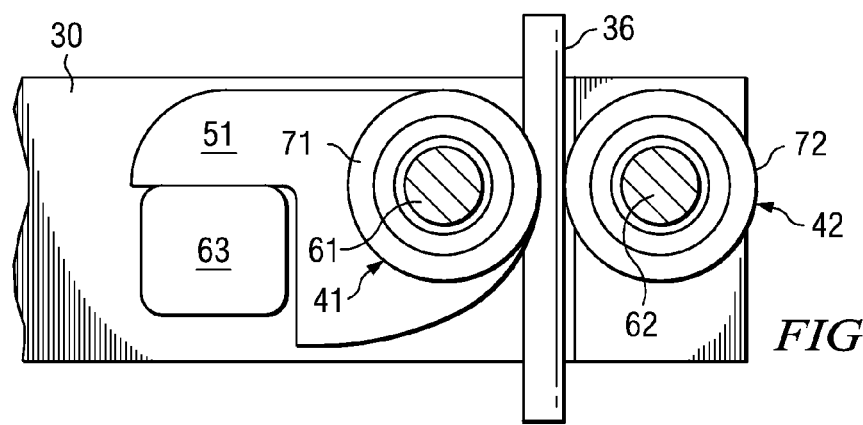
Figure 18:
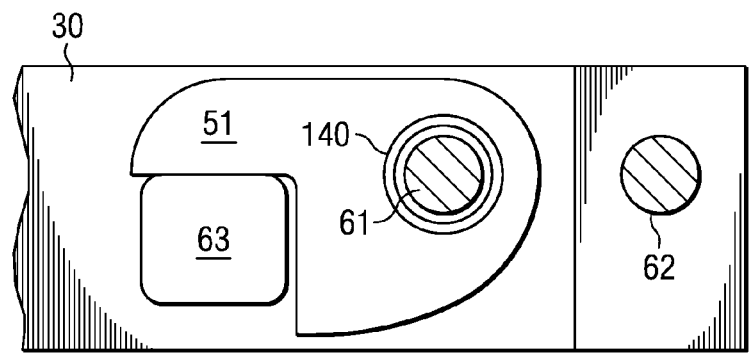

FIGS. 16-18 show various views of a ninth embodiment of the present invention. FIG. 16 is a top view of the ninth embodiment. FIGS. 17 and 18 are side views for FIG. 16, as taken along lines 17-17 and 18-18, respectively, in FIG. 16. In the ninth embodiment, one piezoelectric element 51 is located on the first shaft 61 between the first bearing member 41 and the support member 30. The piezoelectric element 51 rests on a stop portion 63, which extends from the support member 30. The stop portion 63 has a generally rectangular cross-section shape in this example (see e.g., FIGS. 17 and 18). The stop portion 63 may be attached to the support member 30 as separate piece, or the stop portion 63 may be an integral part of the support member 30, for example. The stop portion 63 is positioned relative to the piezoelectric element 51 so that it limits the rotational movement of the piezoelectric element 51 about the first shaft 61. As shown in FIG. 16, the first shaft 61 may have a collar 126 to retain the position of the first bearing 41 along the first shaft 61 (i.e., between the collar 126 and the first shaft head 101). The piezoelectric element 51 may have a recess 140 to allow it to press against the first race 71 without or before it presses against the collar 126 (see FIGS. 16 and 18), for example. Also illustrated in FIG. 16, the first outer end 84 of the first bearing race 71 may have a concave shape matching the contour of the wire diameter and the second outer end 94 of the second bearing race 72 may have a flat shape, for example.

Figure 19:
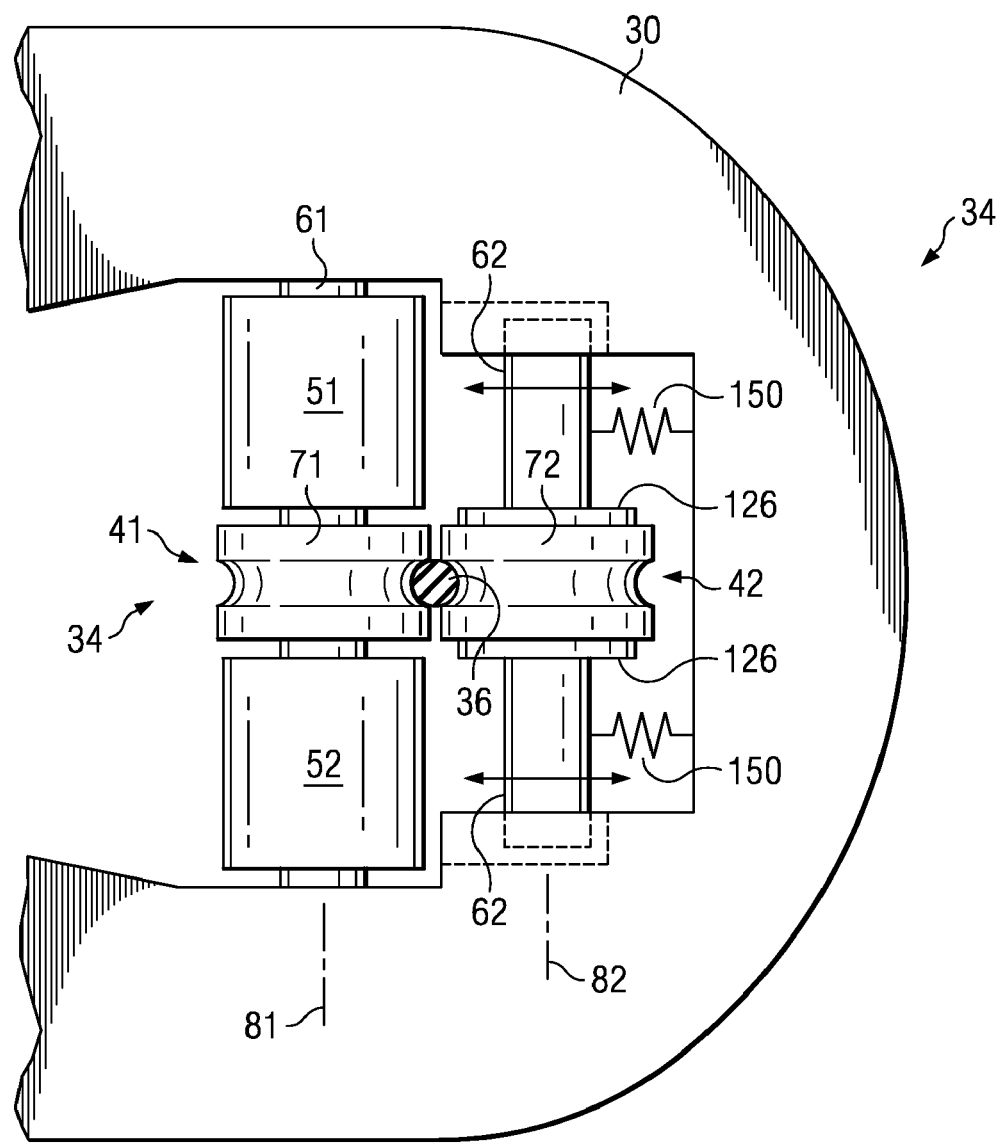
FIGS. 19 and 20 are top views of a tenth embodiment of the present invention.
Figure 20:
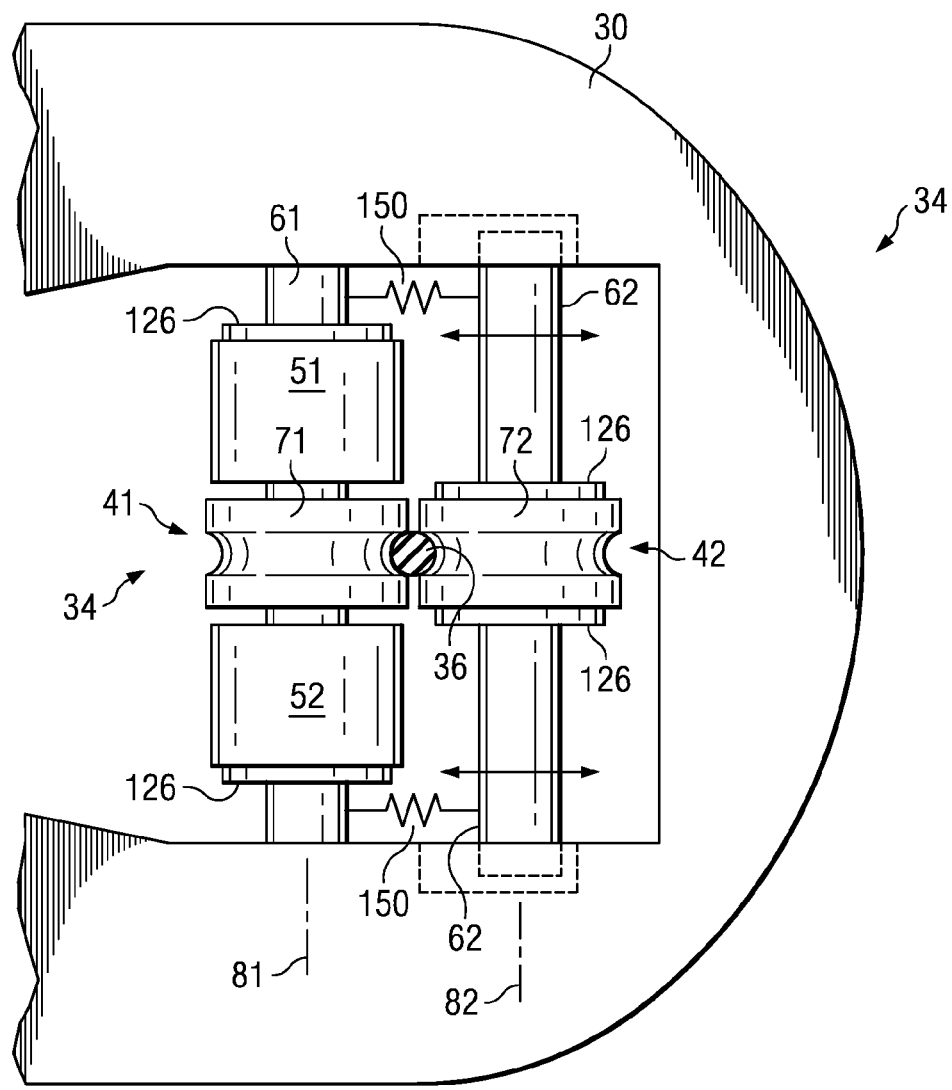

FIGS. 19 and 20 are top views for two variations of a tenth embodiment of the present invention. In the tenth embodiment, a spring member 150 is configured to bias the second bearing race 72 toward the first bearing race 71. The second race 72 may be biased toward the first race 71 in a variety of ways. For example, the second shaft 62 may be biased toward the first shaft 61, as shown in FIGS. 19 and 20 by a spring member 150. The spring member 150 may be any suitable type or configuration of spring or material for providing a spring bias force, including (but not limited to): a leaf spring, a coil spring, a spiral spring, a volute spring, a stretched elastic member, a compressed elastic member, and combinations thereof, for example. The variations shown in FIGS. 19 and 20 are simplified schematics illustrating just a few examples among many possible configurations. Also, the first bearing race 71 may be biased toward the second bearing race 72 (i.e., the first bearing race 71 being configured to be moved toward the second bearing race 72. With benefit of this disclosure, one of ordinary skill in the art will likely realize many other possible configurations for a tenth embodiment of the present invention.

One advantage of an embodiment of the present invention is that the wire 36 may be stopped using a wire braking apparatus 34 of an embodiment without damaging or while causing less damage to the wire as compared to a conventional bond head that clamps the wire between two flat plates, for example. Piezoelectric elements may provide very controllable braking of the wire in varying amounts, depending in part upon the amount of voltage applied to the piezoelectric element(s). As yet another variation to any of the embodiments, a surface of the piezoelectric element may be coated with or may have applied thereto a different material (e.g., rubber, plastic, stone, metal, wood, etc.) to provide a friction surface for pressing against the bearing race. Such different material may or may not be easily replaceable (e.g., as a wearable part). Also or in alternative, a different material (e.g., rubber, plastic, stone, metal, wood, etc.) may be coated on or applied to a surface (e.g., side(s) and/or end portion) of the bearing race(s) to affect the friction rate between the bearing race(s) and the piezoelectric element(s), and/or between the bearing race(s) and the wire, for example.

The material of the bearing race(s) may be varied to provide a desired coefficient of friction between the bearing race(s) and the piezoelectric element(s), and/or between the bearing race(s) and the wire. In yet another embodiment of the present invention (not shown), the first bearing race may be coupled to the second bearing race by physical contact (i.e., friction) and/or by gears, for example. In such case, the braking of the first bearing race may thereby brake the second bearing race directly (rather than via the wire). In still another embodiment of the present invention (not shown), three or more bearings may be contacting the wire in, at, and/or near the wire braking apparatus, and any number of such bearings may be braked using piezoelectric elements, for example. With the benefit of this disclosure, one of ordinary skill in the art may realize many other variations and combinations of the embodiments discussed above and/or other embodiments of the present invention.

Although piezoelectric elements have been shown and described in the above illustrative embodiments, other types or configurations of bearing braking actuators may be incorporated into an embodiment of the present invention for braking and/or stopping a bearing's rotation. For example, a bearing braking actuator may include (but not limited to): an electromagnetic displacement actuator, a ferromagnetic element, an electromagnetic element, a solenoid, an air actuated cylinder, an air driven actuator, a liquid actuated cylinder, a liquid driven actuator, an electrical driven actuator, a magnetic driven actuator, a spring driven actuator, or combinations thereof, for example. With the benefit of this disclosure, one of ordinary skill in the art will likely realize many possible variations and substitutions for the piezoelectric element(s) as a bearing braking actuator.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wire bonding machine, comprising:
   a bond head adapted to manipulate a wire, the bond head comprising a wire braking apparatus and a fixed portion;
   the wire braking apparatus comprising:
      a first bearing member comprising a first race adapted to rotate about a first rotational axis of the first bearing member, wherein the first race has a first outer end with a first generally concave-shaped portion, wherein the first race has a first side and a second side, wherein the first and second sides of the first race face opposite directions along the first rotational axis;
      a second bearing member comprising a second race adapted to rotate about a second rotational axis of the second bearing member, wherein the second race has a second outer edge with a second generally concave-shaped portion, wherein the first outer end of the first race faces the second outer end of the second race; and
      a first piezoelectric element located between the first bearing and the fixed portion of the bond head,
         the first piezoelectric element being configured so that a first tolerance gap exists between the first piezoelectric element and at least one of the first race and the fixed portion when the first piezoelectric element is not energized, and
         the first piezoelectric element being configured so that the first piezoelectric element may be energized to expand between the fixed portion and the first bearing thereby substantially eliminating the first tolerance gap, and to press against the first side of the first race thereby hindering rotational movement of the first race relative to the fixed portion of the bond head.

2. The wire bonding machine of claim 1, wherein the bond head further comprises:
   a support member;
   a first shaft extending from the support member, wherein the first rotational axis extends along the first shaft, and wherein the first bearing member is located on the first shaft;
   a second shaft extending from the support member, wherein the second rotational axis extends along the second shaft, and wherein the second bearing member is located on the second shaft.

3. The wire bonding machine of claim 2, wherein the fixed portion is part of the support member, and wherein the first piezoelectric element is located on the first shaft between the first bearing member and the support member.

4. The wire bonding machine of claim 3, wherein the first shaft has a first shaft head on a distal end thereof, and wherein the bond head further comprises:
   a second piezoelectric element located on the first shaft between the first bearing and the first shaft head of the first shaft, the second piezoelectric element being configured so that a second tolerance gap exists between the second piezoelectric element and at least one of the first race and the first shaft head when the second piezoelectric element is not energized, and the second piezoelectric element being configured so that the second piezoelectric element may be energized to expand between the first shaft head and the first bearing thereby substantially eliminating the second tolerance gap, and to press against the second side of the first race thereby hindering rotational movement of the first race relative to the first shaft head.

5. The wire bonding machine of claim 4, wherein the bond head further comprises a third shaft extending from the support member, wherein the third shaft extends through the first and second piezoelectric elements.

6. The wire bonding machine of claim 4, wherein the bond head further comprises a stop portion extending from the support member, the stop portion being positioned relative to the first and second piezoelectric elements such that the stop portion limits a rotational range of motion of the first and second piezoelectric elements about the first rotational axis of the first shaft.

7. The wire bonding machine of claim 4, wherein the second race has a first side and a second side, wherein the first and second sides of the second race face opposite directions along the second rotational axis, wherein the second shaft has a second shaft head on a distal end thereof, and wherein the bond head further comprises:

a third piezoelectric element located on the second shaft between the second bearing and the support member of the bond head, the third piezoelectric element being configured so that a third tolerance gap exists between the third piezoelectric element and at least one of the second race and the support member when the third piezoelectric element is not energized, and the third piezoelectric element being configured so that the third piezoelectric element may be energized to expand between the support member and the second bearing thereby substantially eliminating the third tolerance gap, and to press against the first side of the second race thereby hindering rotational movement of the second race relative to the support member;

a fourth piezoelectric element located between the second bearing and the second shaft head of the second shaft, the fourth piezoelectric element being configured so that a fourth tolerance gap exists between the fourth piezoelectric element and at least one of the second race and the second shaft head when the fourth piezoelectric element is not energized, and the fourth piezoelectric element being configured so that the fourth piezoelectric element may be energized to expand between the second shaft head and the second bearing thereby substantially eliminating the fourth tolerance gap, and to press against the second side of the second race thereby hindering rotational movement of the second race relative to the second shaft head.

8. The wire bonding machine of claim 1, wherein the fixed portion is part of a support member of the bond head, wherein the support member has a first interior side and a second interior side separated by a support member gap, and wherein the bond head further comprises:

a first shaft extending from the first interior side to the second interior side of the support member within the support member gap, wherein the first rotational axis extends along the first shaft, and wherein the first bearing member is located on the first shaft;

a second shaft extending from the first interior side to the second interior side of the support member within the support member gap, wherein the second rotational axis extends along the second shaft, and wherein the second bearing member is located on the second shaft;

a second piezoelectric element located between the first bearing and the second interior side of the support member, the second piezoelectric element being configured so that a second tolerance gap exists between the second piezoelectric element and at least one of the first race and the second interior side of the support member when the second piezoelectric element is not energized, and the second piezoelectric element being configured so that the second piezoelectric element may be energized to expand between the second interior side of the support member and the first bearing thereby substantially eliminating the second tolerance gap, and to press against the second side of the first race thereby hindering rotational movement of the first race relative to the support member.

9. The wire bonding machine of claim 1, wherein the fixed portion is part of a support member of the bond head, wherein the support member has a first interior side and a second interior side separated by a support member gap, wherein the second race has a first side and a second side, wherein the first and second sides of the second race face opposite directions along the second rotational axis, and wherein the bond head further comprises:

a first shaft extending from the first interior side to the second interior side of the support member within the support member gap, wherein the first rotational axis extends along the first shaft, and wherein the first bearing member is located on the first shaft;

a second shaft extending from the first interior side to the second interior side of the support member within the support member gap, wherein the second rotational axis extends along the second shaft, and wherein the second bearing member is located on the second shaft;

a second piezoelectric element located between the first bearing and the second interior side of the support member, the second piezoelectric element being configured so that a second tolerance gap exists between the second piezoelectric element and at least one of the first race and the second interior side of the support member when the second piezoelectric element is not energized, and the second piezoelectric element being configured so that the second piezoelectric element may be energized to expand between the second interior side of the support member and the first bearing thereby substantially eliminating the second tolerance gap, and to press against the second side of the first race thereby hindering rotational movement of the first race relative to the support member;

a third piezoelectric element located on the second shaft between the second bearing and the first interior side of the support member, the third piezoelectric element being configured so that a third tolerance gap exists between the third piezoelectric element and at least one of the second race and first interior side of the support member when the third piezoelectric element is not energized, and the third piezoelectric element being configured so that the third piezoelectric element may be energized to expand between first interior side of the support member and the second bearing thereby substantially eliminating the third tolerance gap, and to press against the first side of the second race thereby hindering rotational movement of the second race relative to the support member;

a fourth piezoelectric element located between the second bearing and the second interior side of the support member, the fourth piezoelectric element being configured so that a fourth tolerance gap exists between the fourth piezoelectric element and at least one of the second race and the second interior side of the support member when the fourth piezoelectric element is not energized, and the fourth piezoelectric element being configured so that the fourth piezoelectric element may be energized to expand between the second interior side of the support member and the second bearing thereby substantially eliminating the fourth tolerance gap, and to press against the second side of the second race thereby hindering rotational movement of the second race relative to the support member.

10. The wire bonding machine of claim 3, wherein the bond head further comprises a stop portion extending from the support member, the stop portion being positioned relative to the first piezoelectric element such that the stop portion limits a rotational range of motion of the first piezoelectric element about the first rotational axis of the first shaft.

11. The wire bonding machine of claim 2, wherein the bond head further comprises:
third and fourth shafts extending from the support member, wherein the first piezoelectric element is supported by the third and fourth shafts.

12. The wire bonding machine of claim 1, wherein the fixed portion is part of a support member of the bond head, wherein the support member has a first interior side and a second interior side separated by a support member gap, and wherein the bond head further comprises:
a first shaft extending from the first interior side to the second interior side of the support member within the support member gap, wherein the first rotational axis extends along the first shaft, and wherein the first bearing member is located on the first shaft;
a second shaft extending from the first interior side to the second interior side of the support member within the support member gap, wherein the second rotational axis extends along the second shaft, and wherein the second bearing member is located on the second shaft;
a first piezo support member extending from the first interior side to the second interior side of the support member within the support member gap;
a second piezoelectric element located between the first bearing and the second interior side of the support member,
the second piezoelectric element being configured so that a second tolerance gap exists between the second piezoelectric element and at least one of the first race and the second interior side of the support member when the second piezoelectric element is not energized, and
the second piezoelectric element being configured so that the second piezoelectric element may be energized to expand between the second interior side of the support member and the first bearing thereby substantially eliminating the second tolerance gap, and to press against the second side of the first race thereby hindering rotational movement of the first race relative to the support member,
wherein the first piezo support member at least partially supports the first and second piezoelectric elements.

13. The wire bonding machine of claim 12, wherein the bond head further comprises:
a second piezo support member extending from the first interior side to the second interior side of the support member within the support member gap, wherein the second piezo support member at least partially supports the first and second piezoelectric elements.

14. The wire bonding machine of claim 1, wherein the first generally concave-shaped portion of the first race has a radius smaller than a radius of a wire for which the bond head is adapted to manipulate.

15. The wire bonding machine of claim 1, wherein the first generally concave-shaped portion of the first race has a radius equal to or greater than a radius of a wire for which the bond head is adapted to manipulate.

16. The wire bonding machine of claim 1, wherein the bond head further comprises a spring member configured to bias the second race toward the first race.

17. The wire bonding machine of claim 1, wherein the bond head further comprises a spring member configured to bias the first race toward the second race.

18. A wire bonding machine, comprising:
a bond head adapted to manipulate a wire, the bond head comprising a wire braking apparatus and a support member;
the wire braking apparatus comprising:
a first bearing member comprising a first race adapted to rotate about a first rotational axis of the first bearing member;
a second bearing member comprising a second race adapted to rotate about a second rotational axis of the second bearing member, wherein the first race is opposite the second race in a configuration for accepting a wire fed between and in contact with the first and second race; and
a first piezoelectric element located proximate to the first race of the first bearing so that a first tolerance gap exists between the first piezoelectric element and the first race when the first piezoelectric element is not energized, and so that the first piezoelectric element may be energized to expand to thereby substantially eliminate the first tolerance gap and to press against the first race thereby hindering rotational movement of the first race relative to the support member of the bond head.

19. The wire bonding machine of claim 18, wherein the first race has a first outer end with a first generally concave-shaped portion, and wherein the second race has a second outer edge with a second generally concave-shaped portion, wherein the first outer end of the first race faces the second outer end of the second race.

20. The wire bonding machine of claim 18, wherein the first race has a first side and a second side, wherein the first and second sides of the first race face opposite directions along the first rotational axis, wherein the first piezoelectric element is positioned and configured so that the first piezoelectric element may be energized to expand between the support member and the first bearing thereby substantially eliminating the first tolerance gap, and to press against the first side of the first race thereby hindering rotational movement of the first race relative to the support member.

* * * * *